(12) United States Patent
Granizo Cuadrado et al.

(10) Patent No.: US 12,489,398 B2
(45) Date of Patent: Dec. 2, 2025

(54) OPERATION POINT STABILIZATION FOR VCO-ADC USING SWITCHED-CAPACITOR FREQUENCY-TO-CURRENT CONVERSION

(71) Applicant: Infineon Technologies AG, Neubiberg (DE)

(72) Inventors: Javier Granizo Cuadrado, Madrid (ES); Pedro Augusto Borrego Lambin Torres Amaral, Villach (AT); Victor Medina, Madrid (ES); Andres Quintero Alonso, Villach (AT); Andreas Wiesbauer, Pörtschach (AT); Ruben Garvi Jimenez-Ortiz, Madrid (ES); Luis Hernandez-Corporales, Madrid (ES)

(73) Assignee: INFINEON TECHNOLOGIES AG, Neubiberg (DE)

( * ) Notice: Subject to any disclaimer, the term of this patent is extended or adjusted under 35 U.S.C. 154(b) by 47 days.

(21) Appl. No.: 18/642,340

(22) Filed: Apr. 22, 2024

(65) Prior Publication Data
US 2025/0330122 A1    Oct. 23, 2025

(51) Int. Cl.
*H03B 5/12* (2006.01)
*H03B 5/04* (2006.01)
*H03B 5/36* (2006.01)

(52) U.S. Cl.
CPC ............ *H03B 5/1253* (2013.01); *H03B 5/04* (2013.01); *H03B 5/1228* (2013.01); *H03B 5/364* (2013.01)

(58) Field of Classification Search
CPC .................................................. H03B 5/1253
(Continued)

(56) References Cited

U.S. PATENT DOCUMENTS 10,123,103 B1    11/2018  Buffa et al.
11,025,215 B2 *   6/2021  Chandrakumar ..... A61M 21/00
(Continued)

OTHER PUBLICATIONS

Abidi, A., "Linearization of Voltage-Controlled Oscillators Using Switched-Capacitor Feedback," IEEE Journal of Solid-State Circuits, vol. sc-22, No. 3, Jun. 1987, p. 494-496, 3 pages total.
(Continued)

*Primary Examiner* — Joseph Chang
(74) *Attorney, Agent, or Firm* — Slater Matsil, LLP

(57) ABSTRACT

A circuit includes: a micro-electromechanical system (MEMS) microphone configured to generate a voltage signal at an output terminal of the MEMS microphone in response to a sound signal; a voltage-controlled-oscillator (VCO) coupled to the output terminal of the MEMS microphone and configured to output, at an output terminal of the VCO, a frequency modulated signal having a frequency proportional to the voltage signal; a frequency-to-digital (FTD) converter coupled to the output terminal of the VCO and configured to convert the frequency modulated signal into a digital output signal proportional to the frequency; a frequency-to-voltage (FTV) conversion circuit coupled to the output terminal of the VCO and configured to generate a bias voltage at an output terminal of the FTV conversion circuit in accordance with the frequency modulated signal; and a resistor coupled between the output terminal of the MEMS microphone and the output terminal of the FTV conversion circuit.

20 Claims, 11 Drawing Sheets

(58) Field of Classification Search
USPC .................................................. 331/177 V
See application file for complete search history.

(56) References Cited

U.S. PATENT DOCUMENTS

2018/0310087 A1* 10/2018 Buffa .................. H03K 3/0315
2023/0123370 A1    4/2023 Hernandez et al.

OTHER PUBLICATIONS

Garvi et al., "A VCO-ADC Linearized by a Capacitive Frequency-to-Current Converter," IEEE Transactions on Circuits and Systems—II: Express Briefs, vol. 70, No. 6, Jun. 2023, pp. 1841-1845, 5 pages total.
Perez et al., "A VCO-Based ADC With Direct Connection to a Microphone MEMS, 80-dB Peak SNDR and 438-μW Power Consumption," IEEE Sensors Journal, vol. 23, No. 8, Apr. 15, 2023, pp. 8466-8477, 12 pages total.

* cited by examiner

OPERATION POINT STABILIZATION FOR VCO-ADC USING SWITCHED-CAPACITOR FREQUENCY-TO-CURRENT CONVERSION

TECHNICAL FIELD

The present invention relates generally to circuits, and in particular embodiments, to voltage-controlled-oscillator-based analog-to-digital converters (VCO-ADCs).

BACKGROUND

Micro-electromechanical system (MEMS) microphones are now widely used in electronic devices due to their small format factors and low cost. Traditionally, the analog output of a microphone is converted into a digital output signal by a voltage encoding-based system such as a sigma-delta analog-to-digital converter (ΣΔ-ADC), which converts the output voltage of the microphone into the digital output signal using an analog-to-digital converter (ADC).

Voltage-controlled-oscillator-based ADCs (VCO-ADCs) are promising alternatives to conventional voltage encoding-based systems, and are well suited for low-cost digital microphone (e.g., MEMS microphone) applications. Its principle of operation is to convert an analog input voltage signal into a variable frequency digital signal. Afterward, a frequency-to-digital (FTD) converter of the VCO-ADC converts the variable frequency digital signal into a multibit digital output signal at a sampling frequency determined by a system sampling clock signal. While VCO-ADCs have advantages over the conventional voltage encoding-based systems, challenges remain for using VCO-ADCs, e.g., in MEMS microphone systems.

SUMMARY

In accordance with an embodiment, a circuit includes: a micro-electromechanical system (MEMS) microphone configured to, in response to a sound signal, generate a differential output signal that includes a first voltage signal at a first output terminal of the MEMS microphone and a second voltage signal at a second output terminal of the MEMS microphone; a first voltage-controlled-oscillator (VCO) coupled to the first output terminal of the MEMS microphone, wherein the first VCO is configured to output, at an output terminal of the first VCO, a first frequency modulated signal having a first frequency proportional to the first voltage signal; a second VCO coupled to the second output terminal of the MEMS microphone, wherein the second VCO is configured to output, at an output terminal of the second VCO, a second frequency modulated signal having a second frequency proportional to the second voltage signal; a Common-Mode Feedback (CMFB) circuit coupled to the output terminal of the first VCO and the output terminal of the second VCO, wherein the CMFB circuit is configured to generate, at an output terminal of the CMFB circuit, a bias voltage based on the first frequency modulated signal and the second frequency modulated signal, wherein the bias voltage is proportional to a rest frequency of the first VCO, wherein the rest frequency of the first VCO is the first frequency of the first frequency modulated signal when no sound signal is sent to the MEMS microphone; a first resistor coupled between the first output terminal of the MEMS microphone and the output terminal of the CMFB circuit; and a second resistor coupled between the second output terminal of the MEMS microphone and the output terminal of the CMFB circuit.

In accordance with an embodiment, a circuit includes: a micro-electromechanical system (MEMS) microphone configured to generate a first voltage signal at a first output terminal of the MEMS microphone in response to a sound signal; a first voltage-controlled-oscillator (VCO) coupled to the first output terminal of the MEMS microphone, wherein the first VCO is configured to output, at an output terminal of the first VCO, a first frequency modulated signal having a first frequency proportional to the first voltage signal; a first frequency-to-digital (FTD) converter coupled to the output terminal of the first VCO, wherein the first FTD converter is configured to convert the first frequency modulated signal into a first digital output signal proportional to the first frequency; a first frequency-to-voltage (FTV) conversion circuit coupled to the output terminal of the first VCO, wherein the first FTV conversion circuit is configured to generate a first bias voltage in accordance with the first frequency modulated signal, and is configured to output the first bias voltage at an output terminal of the first FTV conversion circuit; and a first resistor coupled between the first output terminal of the MEMS microphone and the output terminal of the first FTV conversion circuit.

In accordance with an embodiment, a method of operating a micro-electromechanical system (MEMS) microphone system includes: generating, by a MEMS microphone, a differential output signal in response to a sound signal, wherein the differential output signal includes a first voltage signal at a first output terminal of the MEMS microphone and a second voltage signal at a second output terminal of the MEMS microphone; generating, by a first voltage-controlled-oscillator (VCO) coupled to the first output terminal of the MEMS microphone, a first frequency modulated signal having a first frequency proportional to the first voltage signal; generating, by a second VCO coupled to the second output terminal of the MEMS microphone, a second frequency modulated signal having a second frequency proportional to the second voltage signal; generating, by a Common-Mode Feedback (CMFB) circuit coupled to the first VCO and the second VCO, a bias voltage based on the first frequency modulated signal and the second frequency modulated signal, wherein the bias voltage is proportional to a rest frequency of the first VCO, wherein the rest frequency of the first VCO is the first frequency of the first frequency modulated signal when no sound signal is sent to the MEMS microphone; and setting a bias voltage of the MEMS microphone by sending the bias voltage to a first terminal of a first resistor and a first terminal of a second resistor, wherein a second terminal of the first resistor and a second terminal of the second resistor are coupled to the first output terminal of the MEMS microphone and the second output terminal of the MEMS microphone, respectively.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EXAMPLES

Figure 1:
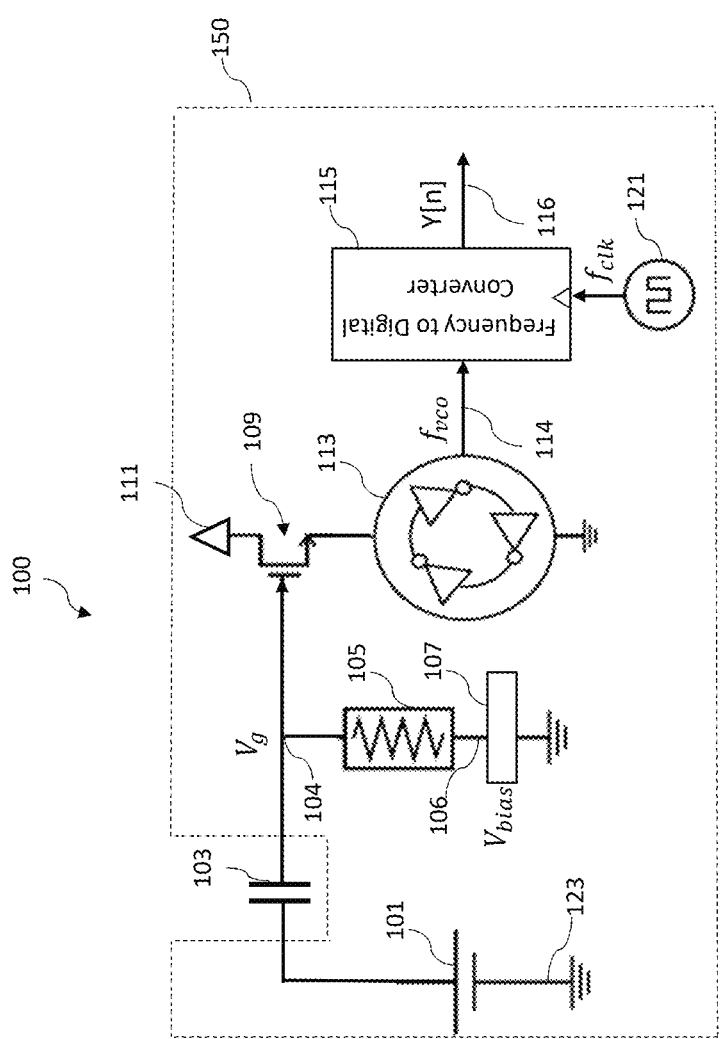
FIG. 1 illustrates a micro-electromechanical system (MEMS) microphone system that includes a capacitive MEMS microphone and a voltage-controlled-oscillator-based analog-to-digital converter (VCO-ADC), in an embodiment.

The making and using of the presently disclosed examples are discussed in detail below. It should be appreciated, however, that the present invention provides many applicable inventive concepts that can be embodied in a wide variety of specific contexts. The specific examples discussed are merely illustrative of specific ways to make and use the invention, and do not limit the scope of the invention. Throughout the discussion herein, unless otherwise specified, the same or similar reference numerals in different figures refer to the same or similar component. For simplicity, details of components with the same or similar reference numeral may not be re-described.

The present disclosure will be described with respect to examples in a specific context, and in particular, MEMS microphone systems that include a capacitive MEMS microphone and a VCO-ADC readout circuit.

FIG. 1 illustrates a system diagram of a MEMS microphone system 100 that includes a capacitive MEMS microphone and a voltage-controlled-oscillator-based analog-to-digital converter (VCO-ADC), in an embodiment. Note that for simplicity, not all features of the MEMS microphone system 100 are illustrated.

As illustrated in FIG. 1, the MEMS microphone system 100 includes a capacitive MEMS microphone 103, which is configured to generate an output voltage $V_g$ in response to a sound signal. In the example of FIG. 1, the capacitive MEMS microphone 103 is or includes a capacitor, where the membrane of the capacitor vibrates in response to the sound pressure to generate the output voltage $V_g$. A high voltage bias (e.g., +12 V voltage) is supplied to the capacitive MEMS microphone 103 to bias the capacitive MEMS microphone 103. The high voltage bias may be provided by a voltage supply 101 (e.g., a charge pump circuit) coupled between the capacitive MEMS microphone 103 and a reference voltage node 123, which reference node 123 is configured to be coupled to a reference voltage, such as electrical ground. An output terminal of the capacitive MEMS microphone 103 is coupled to a node 104. A high-ohmic resistor 105 (e.g., having a resistance in the order of giga-ohms) is coupled between the node 104 and a node 106. In the illustrated embodiment, a bias voltage $V_{bias}$ is provided at the node 106 to set an operation point (e.g., a rest frequency) of the MEMS microphone system 100. As an example, the bias voltage $V_{bias}$ at the node 106 may be provided by a bias circuit 107 of the VCO-ADC, which bias circuit 107 is designed to generate an appropriate bias voltage $V_{bias}$ for the capacitive MEMS microphone 103. Examples of the bias circuit are discussed hereinafter.

In FIG. 1, an input stage circuit 109 is coupled between the node 104 and an input terminal of a voltage-controller-oscillator (VCO) 113. In the example of FIG. 1, the input stage circuit 109 is a source follower circuit comprising a transistor. A gate terminal of the transistor is coupled to the node 104. A drain terminal of the transistor is coupled to a supply voltage node 11 configured to receive a supply voltage (e.g., +3V, +5V, or the like) for the MEMS microphone system 100. A source terminal of the transistor is coupled to the input terminal of the VCO 113. In some embodiments, the input stage circuit 109 (e.g., a source follower circuit) provides a buffered voltage to the VCO 113, which buffered voltage has a voltage value proportional to the output voltage $V_g$ of the capacitive MEMS microphone 103.

The VCO 113 is configured to generate an output signal $f_{vco}$. The frequency of the output signal $f_{vco}$ is modulated (e.g., controlled) by the output voltage $V_g$ of the capacitive MEMS microphone 103. In some embodiments, the frequency of the output signal $f_{vco}$ generated by the VCO 113 is proportional to the output voltage $V_g$, and therefore, the output signal $f_{vco}$ of the VCO 113 is also referred to as a frequency modulated signal $f_{vco}$. The VCO 113 is a ring oscillator, in an example embodiment, although any other suitable type of VCO may also be used as the VCO 113. Voltage controlled oscillators, such as ring oscillators, are known and used in the art, thus details are not discussed here.

Still referring to FIG. 1, an output terminal 114 of the VCO 113 is coupled to an input terminal of a frequency-to-digital (FTD) converter 115. A clock input terminal of the FTD converter 115 (may also be referred to as an F2D converter) is coupled to a system sampling clock $f_{clk}$ generated by a system clock source 121. The system clock source 121 may include an oscillator, a phase-locked loop (PLL), combinations thereof, or the like, and is configured to generate a highly accurate digital clock signal (e.g., $f_{clk}$) at a specified frequency.

The FTD converter 115 is configured to convert the frequency modulated signal $f_{vco}$ into a digital output signal y[n] (e.g., a multi-bit digital signal) at an output terminal 116 of the FTD converter 115. In some embodiments, the FTD converter 115 is configured to generate a digital signal (see, e.g., 230 in FIG. 2B) in accordance with the frequency modulated signal $f_{vco}$ and the system sampling clock signal $f_{clk}$, and is configured to generate the digital output signal y[n] by sampling the digital signal using the system sampling clock signal $f_{clk}$. Details of the FTD converter 115 are discussed hereinafter withe reference to FIGS. 2A and 2B.

In some embodiments, some or all of the components within the region defined by the dashed lines 150 in FIG. 1 are integrated into a semiconductor die, e.g., in an application specification integrated circuit (ASIC) or part of an ASIC. The input stage circuit 109, the VCO 113, the FTD converter 115, and the system clock source 121 may be collectively referred to as a VCO-ADC, or a VCO-ADC readout circuit. In some embodiments, the system clock source 121 is omitted in the VCO-ADC, and the system sampling clock $f_{clk}$ is provided to the VCO-ADC by a clock source external to the VCO-ADC.

Note that in the example of FIG. 1, the capacitive MEMS microphone 103 is shown as a single-ended microphone that generates a singled-ended output signal $V_g$, in order to easily illustrate the working principle of VCO-ADC. The capacitive MEMS microphone 103 may be a differential microphone that generates a differential output comprising a pair of output voltages $V_{g\_p}$ and $V_{g\_n}$, in which case the VCO-ADC may include two parallel branches of circuit to process the output voltages $V_{g\_p}$ and $V_{g\_n}$, where each of the two parallel branches includes a VCO 113 and an FTD converter 115. Examples of MEMS microphone system with differential microphone are discussed hereinafter.

During operation of the MEMS microphone system 100, when no sound is applied to the capacitive MEMS microphone 103, the VCO 113 oscillates at a rest frequency determined by the bias voltage $V_{bias}$ that sets the operation point of the VCO 113 through the high-ohmic resistor 105. Ensuring a stable rest frequency is important for a MEMS microphone system for various reasons. Firstly, drifting of the rest frequency from the nominal value may substantially increase the power consumption of the analog domain if the oscillator (e.g., 113) is running faster than required. Secondly, drifting of the rest frequency may change the gain and the offset of the output signal (e.g., y[n]) at the digital reconstruction. In addition, rest frequency is a key parameter in determining the signal-to-quantization noise ratio (SQNR) of the VCO-ADC. Furthermore, in differential VCO-ADC designs, rest frequency mismatch between the branches of the VCO-ADC also affects the digital reconstruction.

Unfortunately, process-voltage-temperature (PVT) variations strongly affect the rest frequency of VCO-ADCs. PVT variations refers to variations in process, voltage, and temperature. PVT variations can impact the electrical response of circuits and devices. PVT variations may also affect the timing, power, and noise characteristics of a circuit. As such, for conventional VCO-ADCs, a calibration process is performed to reduce the effect of PVT variations. However, the calibration method for conventional VCO-ADCs may require relatively complicated hardware and software design, and may need to be performed periodically and may be labor intensive, thus increasing the cost of VCO-ADCs and power consumption. The present disclosure discloses various embodiments of VCO-ADCs having a feedback loop to automatically compensating for PVT variations, thereby achieving a stable rest frequency without the need for calibration.

Figure 2A:
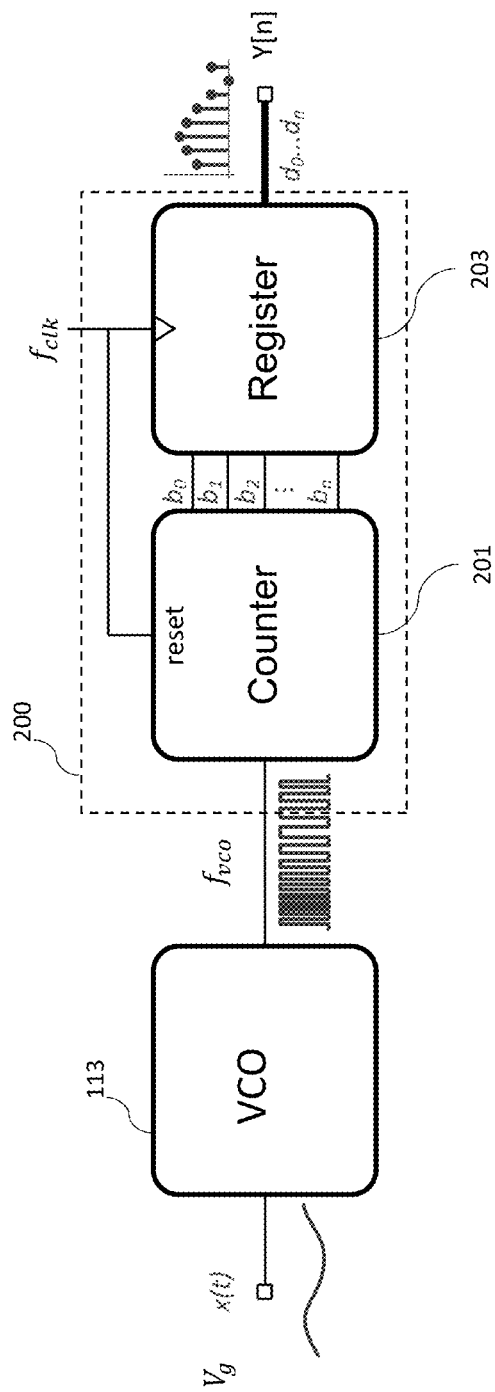
FIG. 2A illustrates a frequency-to-digital (FTD) converter, in an embodiment.

FIG. 2A illustrates a frequency-to-digital (FTD) converter 200, in an embodiment. The FTD converter 200 may be used as the FTD converter 115 in FIG. 1 or the FTD converters (e.g., 315A, 315B) discussed hereinafter. Note that the VCO 113 of FIG. 1 is also shown in FIG. 2A to illustrate the connection of the FTD converter 200, with the understanding that the VCO 113 is not part of the FTD converter 200.

In the example of FIG. 2A, the FTD converter 200 includes a counter 201 and a register 203. An input terminal of the counter 201 is coupled to the VCO 113 to receive the frequency modulated signal $f_{vco}$. A RESET terminal of the counter 201 is coupled to the system sampling clock signal $f_{clk}$. The counter 201 is configured to count the number of cycles (may also be referred to as oscillator cycles) in the frequency modulated signal $f_{vco}$ between adjacent active edges (e.g., rising edges, or falling edges) of the system sampling clock signal $f_{clk}$.

The output of the counter 201, which is a multi-bit digital signal, is sent to the register 203. A clock terminal of the register 203 is coupled to the system sampling clock signal $f_{clk}$. The register 203 is configured to latch the multi-bit digital signal at the output of the counter 201 at active edges of the system sampling clock signal $f_{clk}$. In other words, the multi-bit digital signal at the output of the counter 201 is sampled at the active edges of the system sampling clock signal $f_{clk}$, and the sampled value is outputted as the digital output signal y[n] of the FTD converter 200.

Figure 2B:
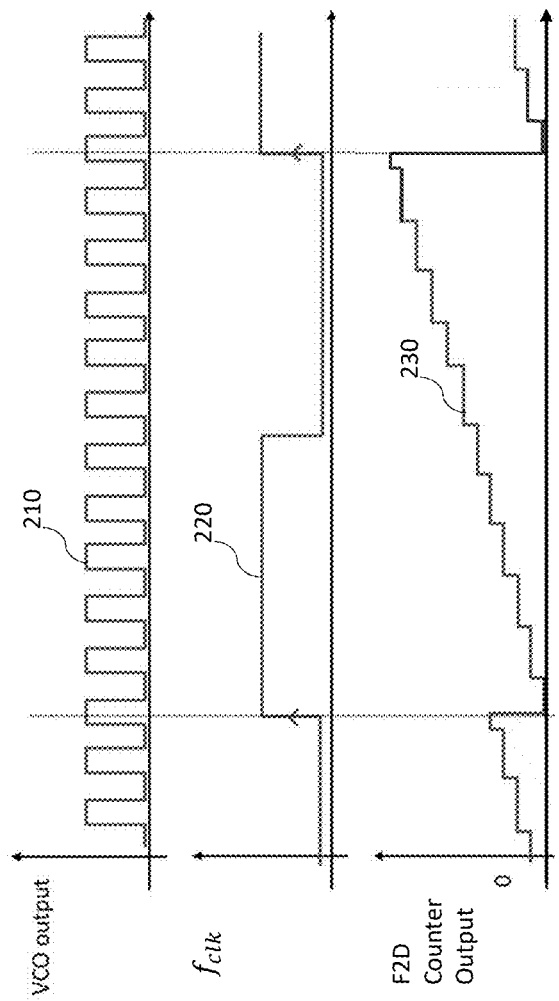
FIG. 2B illustrates output of the FTD converter in FIG. 2A, in an embodiment.

FIG. 2B illustrates output of the FTD converter in FIG. 2A, in an embodiment. In FIG. 2B, the signal 210 in the top subplot illustrates the output of the VCO 113, which is the frequency modulated signal $f_{vco}$. The signal 220 in the middle subplot illustrates the output of the system clock source 121, which is the system sampling clock signal $f_{clk}$. The signal 230 illustrates the output of the counter 201 in the FTD converter 200. As illustrated in FIG. 2B, the counter output resets to zero at the active edges (e.g., rising edges) of the system sampling clock signal $f_{clk}$, then increases as the counter 201 counts the cycles in the frequency modulated signal $f_{vco}$. At the next active edges, the output signal of the counter 201 is latched into the register 203, and the counter 201 is reset to zero again.

Figure 3:
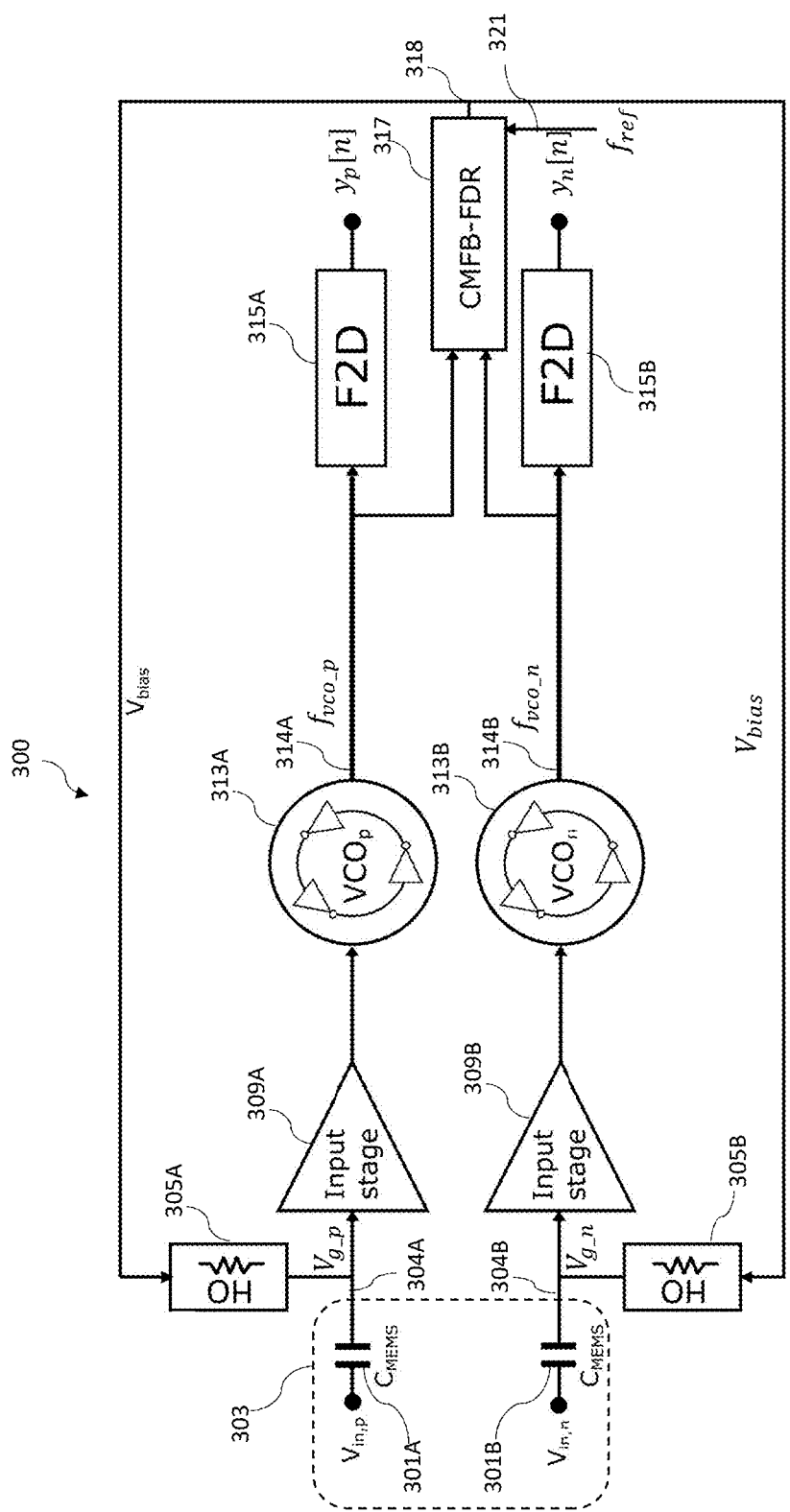
FIG. 3 illustrates a block diagram of a MEMS microphone system that includes VCO-ADCs with a common-mode feedback (CMFB) circuit, in an embodiment.

FIG. 3 illustrates a block diagram of a MEMS microphone system 300 that includes VCO-ADCs with a common-mode feedback (CMFB) circuit 317, in an embodiment. In FIG. 3, the MEMS microphone system 300 includes a capacitive MEMS microphone 303 that outputs a differential output signal, which includes voltages signals $V_{g\_p}$ and $V_{g\_n}$ at a first output terminal and a second output terminal of the capacitive MEMS microphone 303, respectively. Therefore, the MEMS microphone system 300 may also be referred to as a differential MEMS microphone system. In the example of FIG. 3, the capacitive MEMS microphone 303 has two capacitors 301A and 301B for generating the differential output signal. Two high bias voltages $V_{in\_p}$ and $V_{in\_n}$ are supplied to the capacitors 301A and 301B, respectively. This is, of course, merely a non-limiting example. In other embodiments, the capacitive MEMS microphone 303 may include only one capacitor, where both membranes of the capacitor vibrate (e.g., in opposite directions) to generate the differential output signal. Besides the examples discussed above, other suitable types of MEMS microphones may also be used to generate the differential voltage signals $V_{g\_p}$ and $V_{g\_n}$. These and other variations are fully intended to be included within the scope of the present disclosure.

As illustrated in FIG. 3, the MEMS microphone system 300 includes two parallel branches of circuit, e.g., an upper branch for processing the voltage signal $V_{g\_p}$ and a lower branch for processing the voltage signal $V_{g\_n}$. The upper branch includes an input stage 309A, a VCO 313A, an FTD converter 315A, and a high-ohmic resistor 305A. The lower branch includes an input stage 309B, a VCO 313B, an FTD converter 315B, and a high-ohmic resistor 305B. In some embodiments, the voltage signal $V_{g\_p}$ modulates the VCO 313A to generate a frequency modulated signal $f_{vco\_p}$, where the frequency of the frequency modulated signal $f_{vco\_p}$ is proportional to the voltage signal $V_{g\_p}$. The frequency modulated signal $f_{vco\_p}$ is then converted into a digital output signal $y_p[n]$ by the FTD converter 315A. Similarly, the voltage signal $V_{g\_n}$ modulates the VCO 313B to generate a frequency modulated signal $f_{vco\_n}$, where the frequency of the frequency modulated signal $f_{vco\_n}$ is proportional to the voltage signal $V_{g\_n}$. The frequency modulated signal $f_{vco\_n}$ is then converted into a digital output signal $y_n[n]$ by the FTD converter 315B. The difference between the digital output signals $y_p[n]$ and $y_n[n]$ (e.g., $y_p[n]-y_n[n]$) is used as the output of the MEMS microphone system 300, in some embodiments. The input stages 309A and 309B, the VCOs 313A and 313B, the FTD converters 315A and 315B, and the high-ohmic resistors 305A and 305B are the same as or similar to the input stage circuit 109, the VCO 113, the FTD converter 115, and the high-ohmic resistor 105 in FIG. 1, respectively, thus details are not repeated.

Notably, the MEMS microphone system 300 includes the CMFB circuit 317. Input terminals of the CMFB circuit 317 are coupled to output terminals of the VCOs 313A and 313B. The CMFB circuit 317 generates a common-mode output voltage $V_{bias}$ based on the frequency modulated signals $f_{vco\_p}$ and $f_{vco\_n}$.

In some embodiments, the common-mode output voltage $V_{bias}$ is proportional to the sum of the frequencies of the frequency modulated signals $f_{vco\_p}$ and $f_{vco\_n}$. In the illustrated embodiment, the upper branch circuit and the lower branch circuit in the MEMS microphone system 300 are identical (e.g., formed by implementing the same circuit twice in hardware), and therefore, the rest frequency of the VCO 313A is the same as that of the VCO 313B. Due to the differential output of the capacitive MEMS microphone 303, and given the configuration of the MEMS microphone system 300 shown in FIG. 3, the sum of the frequencies of the frequency modulated signals $f_{vco\_p}$ and $f_{vco\_p}$ is equal to two times the rest frequency of the VCO 313A (or 313B) due to differential cancellation at the frequency-dependent resistors (FDRs) 404A and 404B (see FIG. 4) of the MEMS microphone system 300, details of which are discussed hereinafter. Therefore, in the illustrated embodiment of FIG. 3, the common-mode output voltage $V_{bias}$ is proportional to the rest frequency of the VCO 313A (or 313B).

The common-mode output voltage $V_{bias}$ is used as a common bias voltage for the input stages of the MEMS microphone system 300, and is applied to the input stages 309A and 309B via high-ohmic resistors 305A and 305B, respectively. The feedback of the common-mode output voltage $V_{bias}$ to the input stages thus forms a feedback loop that ensures a stable rest frequency value against PVT variations through closed-loop feedback control. The upper branch circuit, the lower branch circuit, and the CMFB circuit 317 may be collectively referred to as the VCO-ADC of the MEMS microphone system 300.

Figure 4:
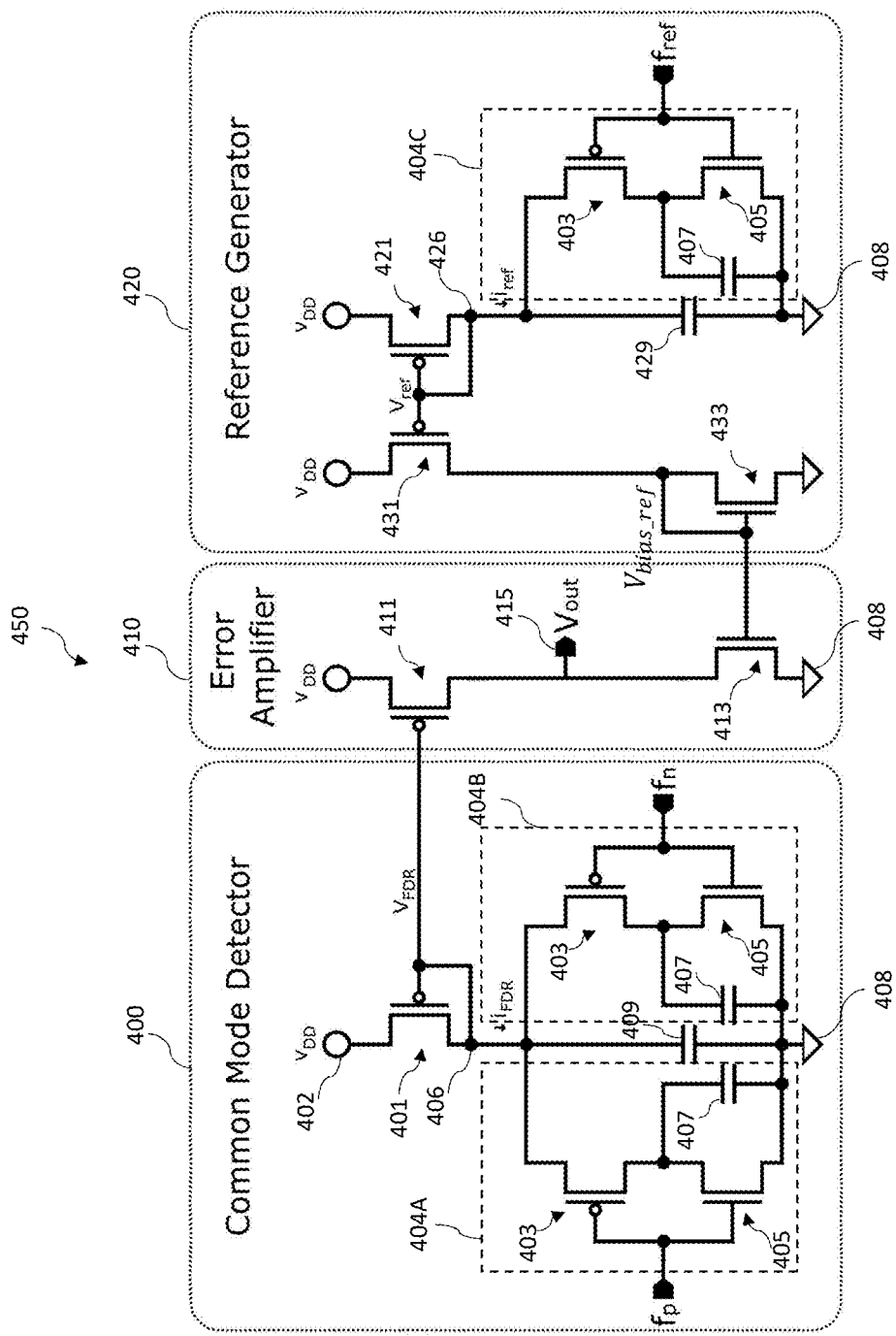
FIG. 4 illustrates a circuit diagram of the CMFB circuit in FIG. 3, in an embodiment.

FIG. 4 illustrates a circuit diagram of a CMFB circuit 450, in an embodiment. The CMFB circuit 450 may be used as the CMFB circuit 317 in FIG. 3. As illustrated in FIG. 4, the CMFB circuit 450 includes a common mode detector 400, an error amplifier 410, and a reference generator 420. The common-mode detector 400 using frequency-dependent resistors (FDRs) 404A and 404B to produce a current output $i_{FDR}$, and the error amplifier 410 converts the current output $i_{FDR}$ into a bias voltage to drive the high-ohmic resistors 305A and 305B (see FIG. 3) and to bias the input stage of the VCO-ADC. The reference generator 420 is used to compensate PVT variations automatically, so that the bias voltage generated by the error amplifier 410 achieves a stable rest frequency for the VCOs 313A and 313B through closed-loop feedback control. Details are discussed hereinafter.

In FIG. 4, the common mode detector 400 includes a diode-connected transistor 401 coupled between a supply voltage node 402 and a node 406. The supply voltage node 402 is configured to be supplied with a supply voltage $V_{DD}$ (e.g., +3V, +5V, or the like). A frequency-dependent resistor (FDR) 404A and an FDR 404B are coupled in parallel between the node 406 and a reference voltage node 408 (e.g., for connecting to electrical ground). A control terminal $f_p$ of the FDR 404A is configured to be coupled to the output terminal 314A of the VCO 313A in FIG. 3 in order to receive the frequency modulated signal $f_{vco\_p}$. A control terminal $f_n$ of the FDR 404B is configured to be coupled to the output terminal 314B of the VCO 313B in FIG. 3 in order to receive the frequency modulated signal $f_{vco\_n}$. A capacitor 409 is coupled between node 406 and the reference voltage node 408. In the example of FIG. 4, the FDRs 404A and 404B have the same structure, and the resistance of the FDR 404A (or 404B) is inversely proportional to the frequency of the frequency modulated signal $f_{vco\_p}$ (or $f_{vco\_n}$).

As illustrated in FIG. 4, the FDR 404A includes a transistor 403 and a transistor 405 coupled in series between the node 406 and the reference voltage node 408, where the transistor 403 is a P-type transistor, and the transistor 405 is an N-type transistor. A gate terminal of the transistor 403 and a gate terminal of the transistor 405 are coupled to the control terminal $f_p$ of the FDR 404A. The FDR 404B has the same structure as the FDR 404A, with the gate terminals of the transistors 403 and 405 of the FDR 404B coupled to the control terminal $f_n$ of the FDR 404B. The principle of operation of the FDR is illustrated in FIG. 5.

Figure 5:
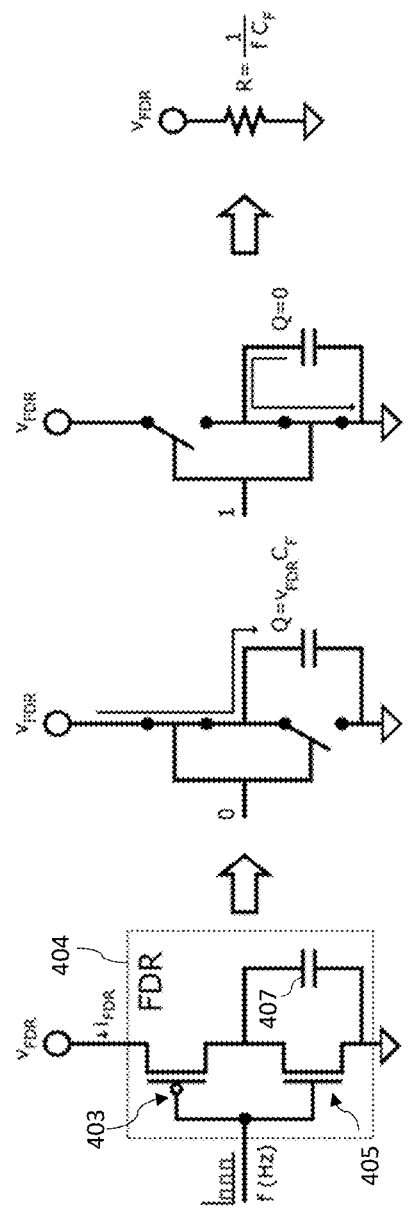
FIG. 5 illustrates a frequency-dependent resistor (FDR), in an embodiment.

FIG. 5 illustrates, at the left-hand side, an FDR 404 having the same structure as the FDRs (e.g., 404A, 404B, 404C) in FIG. 4. The middle portion of FIG. 5 illustrates the equivalent circuits of the FDR 404 when a logic low voltage and a logic high voltage is applied to the control terminal of the FDR 404, respectively. Note that the control signal applied at the control terminal of the FDR 404 switches between the logic high value and the logic low value at a certain switching frequency. The FDR 404 functions as a switched-capacitor circuit whose output resistance is inversely proportional to the input frequency (e.g., switching frequency of the control signal). The right-hand side of FIG. 5 illustrates the FDR 404 as an equivalent resistor with resistance R determined by the switching frequency at its control terminal, where the resistance R is given by:

$$R = \frac{1}{fC_{FDR}} \quad (1)$$

where f is the switching frequency (e.g., frequency of the frequency modulated signal applied at the control terminal), and $C_{FDR}$ is the capacitance of the capacitor 407.

Referring back to FIG. 4, the common mode detector 400 is implemented by placing equally sized FDRs 404A and 404B in parallel and connecting them to each branch (e.g., the upper branch circuit or the lower branch circuit) of the VCO-ADC. Due to the differential nature of the output signals $V_{g\_p}$ and $V_{g\_n}$, when the differential signals caused by a sound signal is applied to the VCO-ADC, the frequency $f_p$ of the output signal $f_{vco\_p}$ of the VCOs 313A may be represented as $f_p=f_0+\Delta f$, and the frequency $f_n$ of the output signal $f_{vco\_n}$ of the VCOs 313B may be represented as $f_n=f_0-\Delta f$, where $f_0$ is the rest frequency, and $\Delta f$ is the change in output frequencies due to the differential output signal. It is straightforward to derive from Equation (1) that equivalent resistance of the parallel connected FDRs 404A and 404B is given by:

$$R_{FDRs} = \frac{1}{C_{FDR}(f_p + f_n)} = \frac{1}{2C_{FDR}f_0} \quad (2)$$

As shown in Equation (2), the equivalent resistance of the parallel connected FDRs 404A and 404B does not change when a sound signal is applied to the VCO-ADC, and is inversely proportional to two times the rest frequency $f_0$. Therefore, it is possible to make a feedback loop to control the value of the rest frequency $f_0$ against a reference provided by the reference generator 420. By placing the diode-connected transistor 401 of a current mirror (formed by the diode-connected transistor 401 and the transistor 411 in the error amplifier 410) on the FDR supply, a current output $i_{FDR}$ (e.g., $i_{FDR}=V_{FDRs}/R_{FDRS}$) proportional to the rest frequency $f_0$ is obtained. The capacitor 409 is placed in parallel to the FDRs 404A and 404B to reduce the ripple in the current output $i_{FDR}$ caused by the FDRs' switching.

Still referring to FIG. 4, the error amplifier 410 comprises a transistor 411 coupled between the supply voltage node 402 and an output terminal 415 (also referred to as an output terminal $V_{out}$) of the CMFB circuit 450. The output terminal 415 corresponds to the output terminal 318 of the CMFB circuit 317 in FIG. 3. A gate terminal of the transistor 411 is coupled to a gate terminal of the diode-connected transistor 401 of the common mode detector 400. The diode-connected transistor 401 and the transistor 411 form a current mirror such that the output current $i_{FDR}$ of the common mode detector 400 is mirrored into the error amplifier 410 and flows through the load path terminals (e.g., source/drain terminals) of the transistor 411. The output current $i_{FDR}$ is converted into the bias voltage $V_{bias}$ at the output terminal 415 through a load impedance 413, which is implemented as a transistor 413 biased with a reference bias voltage $V_{bias\_ref}$ in the example of FIG. 4. The transistor 413 is coupled between the output terminal 415 and the reference voltage node 408. In some embodiments, the voltage drop across the load impedance 413, which is equal to the bias voltage $V_{bias}$ at the output terminal 415, is calculated as the output current $i_{FDR}$ times the drain-source impedance $R_{RS}$ of the transistor 413.

The reference generator 420 mirrors the design of the common mode detector 400 and the error amplifier 410 and cancels the PVT variations of the CMFB circuit 450. In some embodiments, the components of the reference generator 420 are formed to have the same sizes (e.g., physical sizes) as the corresponding components of the common mode detector 400 and the error amplifier 410, and have the same nominal values (e.g., capacitance value) and/or electrical characteristics. By using the reference generator 420, all PVT variations are cancelled simultaneously, thus removing the need for calibration of the CMFB circuit 450.

As illustrated in FIG. 4, the reference generator 420 comprises a diode-connected transistor 421 coupled between the supply voltage node 402 and a node 426. An FDR 404C is coupled between the node 426 and the reference voltage node 408, where the FDR 404C has a same structure as the FDRs 404A and 404B. Note that a control terminal $f_{ref}$ of the FDR 404C is configured to receive a reference frequency signal. The control terminal $f_{ref}$ of the FDR 404C corresponds to the input terminal 321 in FIG. 3. In some embodiments, the reference frequency signal applied at the control terminal $f_{ref}$ is generated by a reference clock source, and is a highly accurate clock signal. The frequency of the reference frequency signal has a fixed relationship with (e.g., is proportional to) the rest frequency $f_0$. A capacitor 429, which corresponds to the capacitor 409 in the common mode detector 400, is coupled between the node 426 and the reference voltage node 408. The reference generator 420 further includes a transistor 431 and a transistor 433 coupled in series between the supply voltage node 402 and the reference voltage node 408. A gate terminal of the transistor 431 is coupled to a gate terminal of the diode-connected transistor 421, and a drain terminal of the transistor 433 and a gate terminal of the transistor 433 are coupled to a gate terminal of the transistor 413 of the error amplifier 410. In some embodiments, the reference frequency signal applied at the control terminal $f_{ref}$ of the FDR 404C generates an output current $i_{ref}$ proportional to the frequency of the reference frequency signal applied at the control terminal $f_{ref}$, which output current $i_{ref}$ is mirrored into the load path terminals (e.g., source/drain terminals) of the transistor 431 and converted into the reference bias voltage $V_{bias\_ref}$. The reference bias voltage $V_{bias\_ref}$ is used to properly bias the transistor 413 and to generate a bias voltage $V_{bias}$ at the output terminal 415 of the CMFB circuit 450.

The performance of the disclosed VCO-ADC with the CMFB circuit 450 has been simulated. Simulations have shown that deviation of the rest frequency is within ±0.8% from the nominal value for a temperature range between −20° C. and 80° C. for all process variations without the need for calibration.

Figure 6:
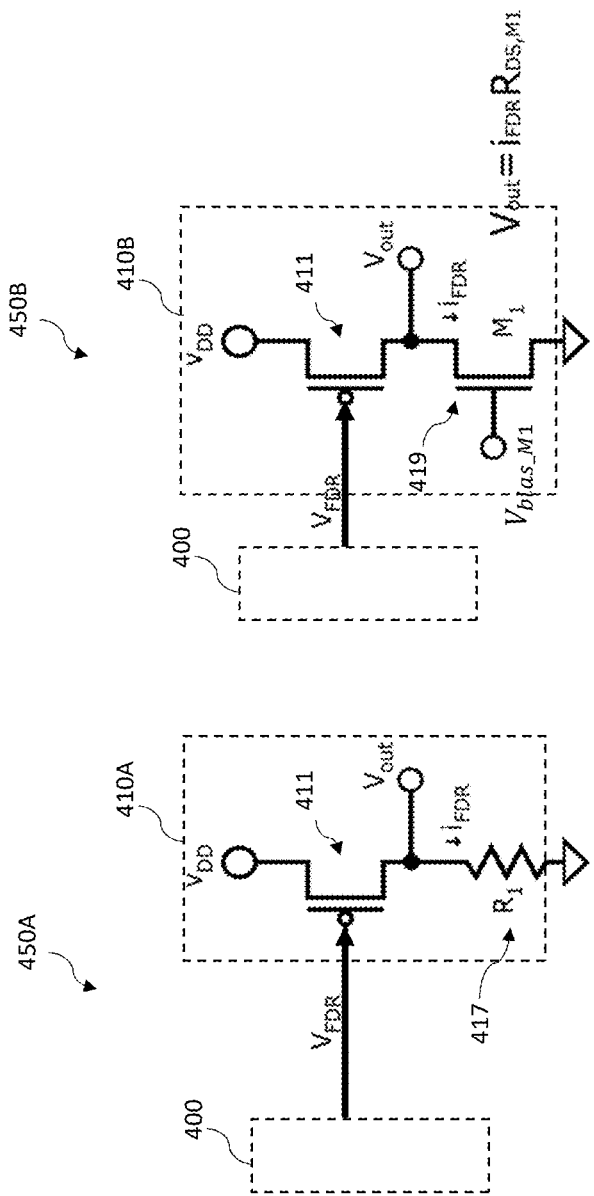
FIGS. 6A and 6B illustrate alternative embodiments of the CMFB circuit 450 in FIG. 4.

FIGS. 6A and 6B illustrate alternative embodiments of the CMFB circuit 450 in FIG. 4. The CMFB circuits in FIGS. 6A and 6B are similar to the CMFB circuit 450, but with the reference generator 420 in FIG. 4 removed. In addition, the error amplifier 410 in FIG. 4 is replaced with a transimpedance amplifier 410A in FIG. 6A and a transimpedance amplifier 410B in FIG. 6B, respectively. The common mode detectors 400 in FIGS. 6A and 6B are the same as that in FIG. 4, thus details are not illustrated.

FIG. 6A illustrates a CMFB circuit 450A, where the load impedance of the transimpedance amplifier 410A is implemented as a resistor 417. The resistor 417 may be implemented as a programmable resistor with e-fuses, where the resistance of the programmable resistor is programmed (e.g., selected) by programming the e-fuses of the programmable resistor. FIG. 6B illustrates a CMFB circuit 450B, where the load impedance of the transimpedance amplifier 410B is implemented as a transistor 419 with a voltage $V_{bias\_M1}$ applied at its gate terminal. By removing the reference generator 420, the CMFB circuits 450A and 450B are simpler, less expensive to fabricate, and may consume less power. However, without the reference generator 420, the bias voltage $V_{bias}$ generated at the output terminals $V_{out}$ may be subject to effects of PVT variations, and therefore, calibration may be needed to compensate for PVT variations. In some embodiments, the calibration process may be done by programming e-fuses after the semiconductor chip comprising the CMFB circuits (e.g., 450A or 450B) is fabricated.

Figure 7:
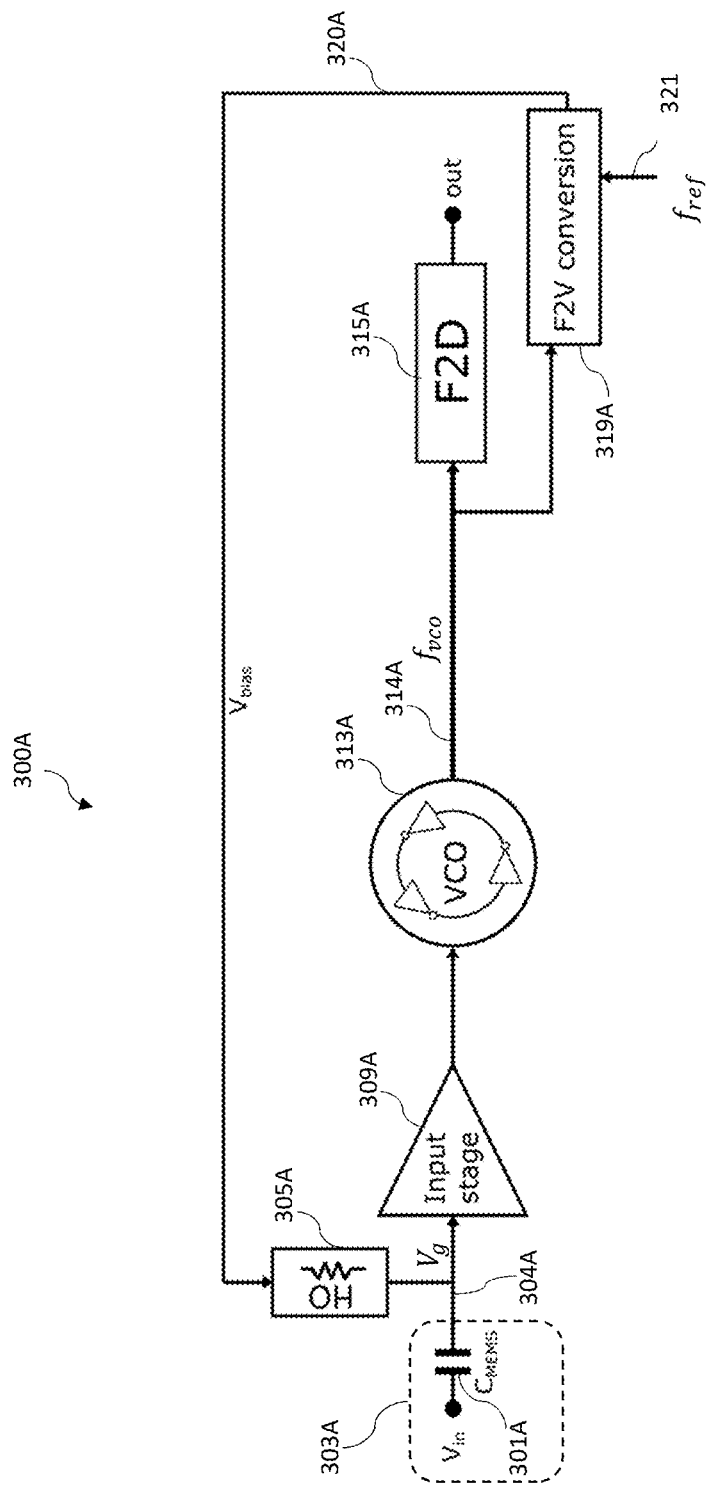
FIG. 7 illustrates a block diagram of a MEMS microphone system that includes a VCO-ADC with a frequency-to-voltage (FTV) conversion circuit, in an embodiment.

FIG. 7 illustrates a block diagram of a MEMS microphone system 300A that includes a VCO-ADC with a frequency-to-voltage (FTV) conversion circuit 319, in an embodiment. The MEMS microphone system 300A is similar to the MEMS microphone system 300 in FIG. 3, but with a capacitive MEMS microphone 303A that outputs a single-ended output signal $V_g$. As a result, the MEMS microphone system 300A includes one branch of circuit instead of the two parallel branches of circuit in FIG. 3. In particular, the MEMS microphone system 300A includes an input stage 309A, a VCO 313A, and an FTD converter 315A. Notably, a frequency-to-voltage (FTV) conversion circuit 319A is coupled to the output terminal of the VCO 313A, and is configured to generate a bias voltage $V_{bias}$ at an output terminal 320A of the FTV conversion circuit 319A in accordance with the frequency modulated signal $f_{vco}$. The bias voltage $V_{bias}$ is fed back to the input stage 309A through a high-ohmic resistor 305A. Therefore, through closed-loop control with feedback, the MEMS microphone system 300A achieves a stable rest frequency. The reference generator 520 (see FIG. 8) of the FTV conversion circuit 319A cancels the effects of PVT variations, and no calibration process is needed for the MEMS microphone system 300A. In some embodiments, the input stage 309, the VCO 313A, the FTD converter 315, and the high-ohmic resistor 305A are the same as or similar to those in FIG. 3, thus details are not repeated. The input stage 309, the VCO 313A, the FTD converter 315, the high-ohmic resistor 305A, the FTV conversion circuit 319A may be collectively referred to as the VCO-ADC circuit of the MEMS microphone system 300A. An embodiment of the FTV conversion circuit 319A is discussed below with reference to FIG. 8.

Figure 8:
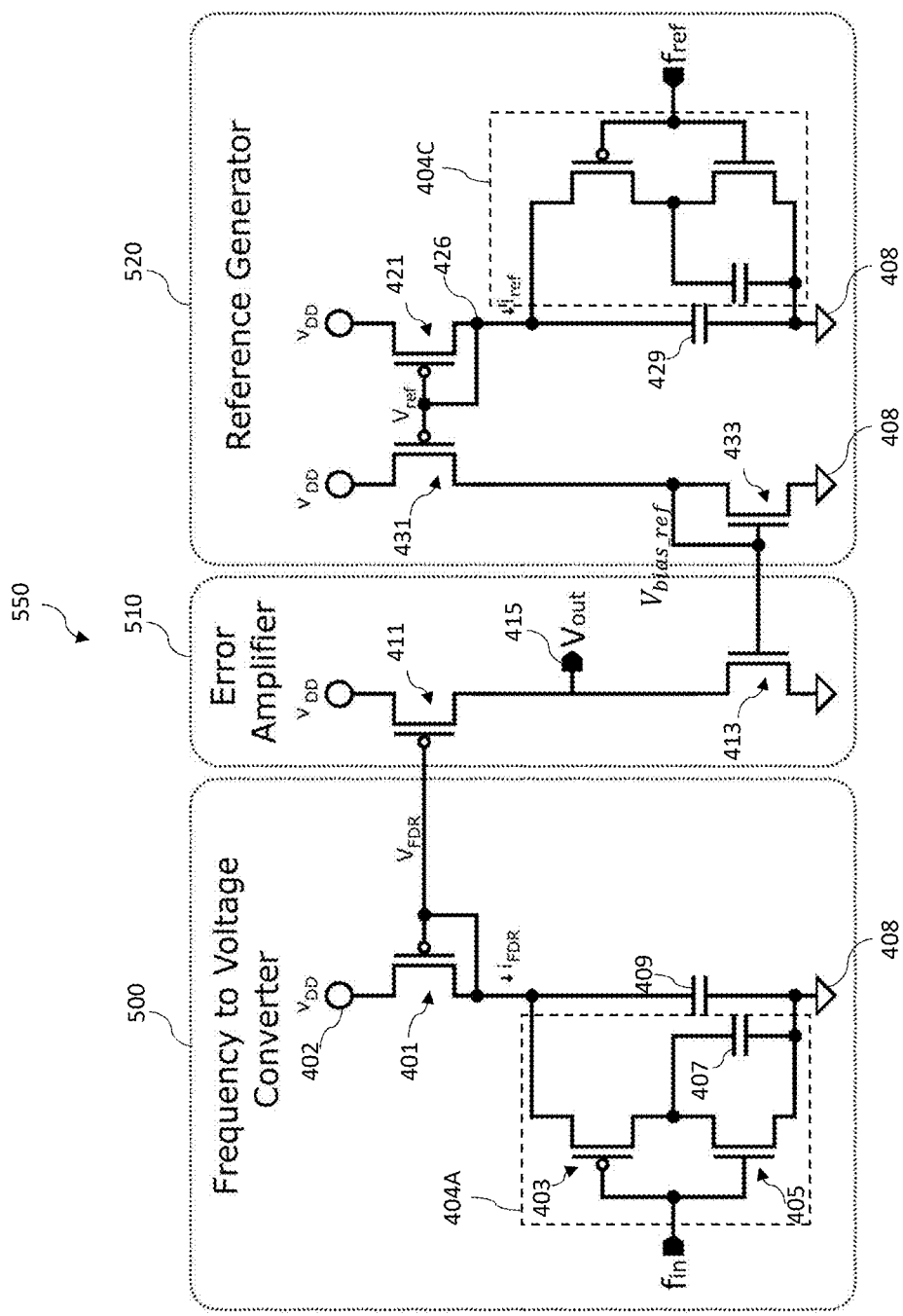
FIG. 8 illustrates a circuit diagram of the FTV conversion circuit in FIG. 7, in an embodiment.

FIG. 8 illustrates a circuit diagram of an FTV conversion circuit 550, in an embodiment. The FTV conversion circuit 550 may be used as the FTV conversion circuit 319A in FIG. 7. In the example of FIG. 8, the FTV conversion circuit 319A includes a frequency-to-voltage (FTV) converter 500, an error amplifier 510, and a reference generator 520. The FTV converter 500 is similar to the common mode detector 400 in FIG. 4, but with the FDR 404B in FIG. 4 removed. The control terminal $f_{in}$ of the FDR 404A of the FTV converter 500 is configured to be coupled to the output terminal 314A of the VCO 313A. The FTV converter 500 is configure to generate an output current $i_{FDR}$ proportional to the frequency of the frequency modulated signal $f_{vco}$.

In FIG. 8, the error amplifier 510 and the reference generator 520 are the same as the error amplifier 410 and the reference generator 420 in FIG. 4, respectively. A control terminal $f_{ref}$ of the FDR 404C in the reference generator 520 is configured to receive a reference frequency signal, where the frequency of the reference frequency signal has a fixed relationship with (e.g., is proportional to) the rest frequency $f_0$. The control terminal $f_{ref}$ of the FDR 404C corresponds to the input terminal 321 in FIG. 7.

In some embodiments, the transistor 411 of the error amplifier 510 forms a current mirror with a diode-connected transistor 401 of the FTV converter 500, and the output current $i_{FDR}$ is converted into the bias voltage $V_{bias}$ by the load impedance 413 (e.g., a transistor), and the bias voltage $V_{bias}$ is outputted at an output terminal 415 of the FTV conversion circuit 550. The output terminal 415 corresponds to the output terminal 320A in FIG. 7. The reference generator 520 mirrors the design of the FTV converter 500 and the error amplifier 510, and functions to cancel effects of PVT variations. The principle of operation of the FTV conversion circuit 550 is similar to the CMFB circuit 450 in FIG. 4. One of ordinary skill in the art, upon reading the present disclosure, should be able to readily apply the teaching of the CMFB circuit 450 to the FTV conversion circuit 550 and understand how the FTV conversion circuit 550 works. Therefore, further details regarding how the FTV conversion circuit 550 works are not discussed here.

Variations and modifications to the FTV conversion circuit 550 are possible and are fully intended to be included within the scope of the present disclosure. For example, an alternative embodiment of the FTV conversion circuit may include the FTV converter 500, but with the reference generator 520 removed and the error amplifier 510 replaced with the transimpedance amplifier 410A (or 410B) in FIG. 6A (or 6B). Stated in another way, the common mode detector 400 in FIG. 6A (or 6B) may be replaced with the FTV converter 500 in FIG. 8 to form alternative embodiment of the FTV conversion circuit.

Figure 9:
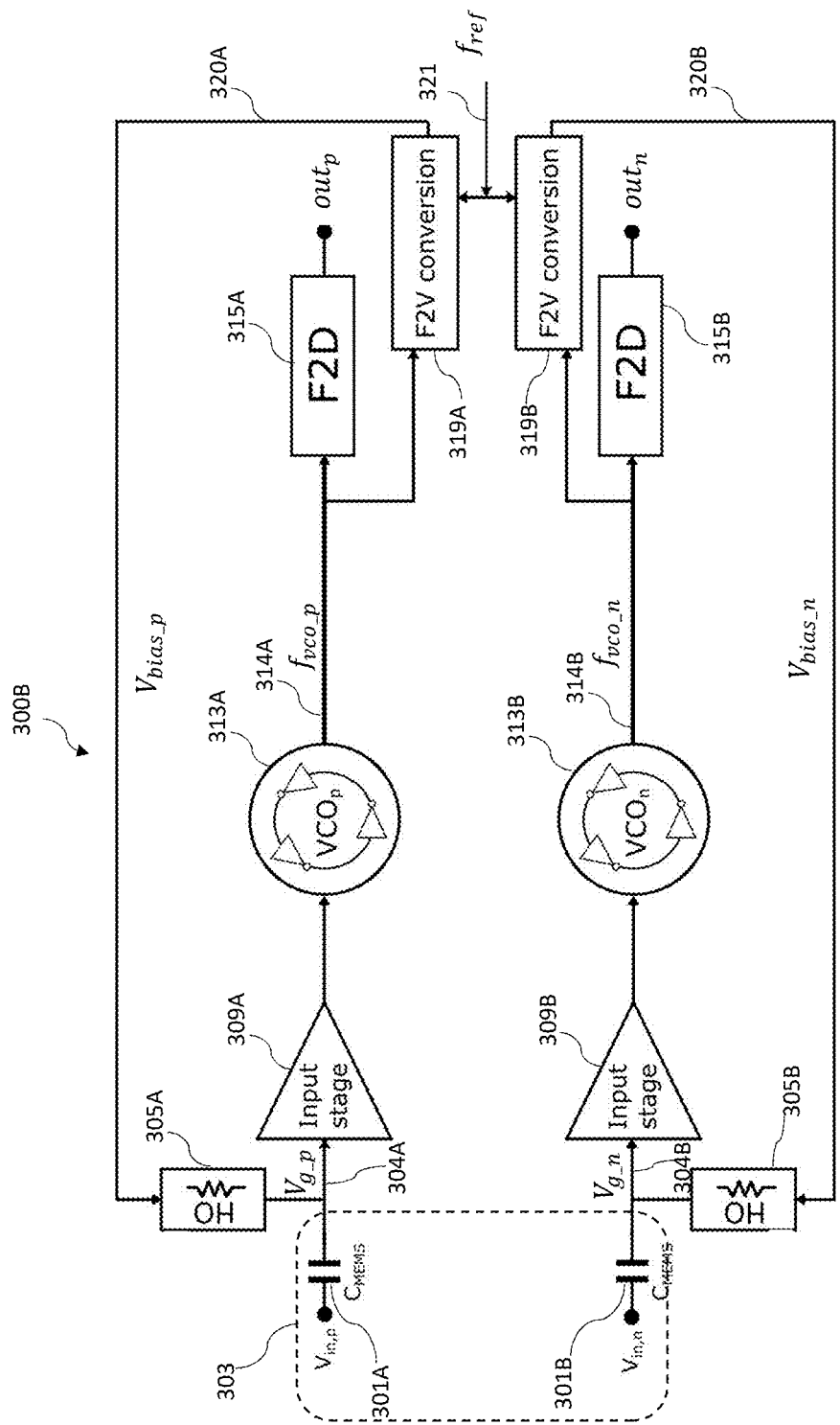
FIG. 9 illustrates a block diagram of a MEMS microphone system that includes VCO-ADCs with FTV conversion circuits, in an embodiment.

FIG. 9 illustrates a block diagram of a MEMS microphone system 300B that includes VCO-ADCs with FTV conversion circuits, in an embodiment. The MEMS microphone system 300B is similar to the MEMS microphone system 300A in FIG. 7, but with a capacitive MEMS microphone 303 that outputs differential output signals $V_{g\_p}$ and $V_{g\_n}$. As a result, the MEMS microphone system 300B includes two parallel branches of circuit for processing the output signals $V_{g\_p}$ and $V_{g\_n}$. For example, an upper branch of circuit of the MEMS microphone system 300B includes an input stage 309A, a VCO 313A, an FTD converter 315A, an FTV conversion circuit 319A, and a high-ohmic resistor 305A. The lower branch of circuit of the MEMS microphone system 300B includes an input stage 309B, a VCO 313B, an FTD converter 315B, an FTV conversion circuit 319B, and a high-ohmic resistor 305B. The upper branch generates a bias voltage $V_{bias\_p}$ that is fed back to the input stage 309A, and to form closed-loop control for stabilizing the rest frequency of the VCO 313A. Similarly, the lower branch generates a bias voltage $V_{bias\_n}$ that is fed back to the input stage 309B, and to form closed-loop control for stabilizing the rest frequency of the VCO 313B. In the illustrated embodiment of FIG. 9, the upper branch of circuit and the lower branch of circuit are copies of the branch of circuit in FIG. 7. In other words, the branch of circuit in FIG. 7 may be implemented twice as the upper and lower branches of circuit in FIG. 9. The principle of operation of the MEMS microphone system 300B may be same as or similar to that of the MEMS microphone system 300A, thus details are not repeated here.

Figure 10:
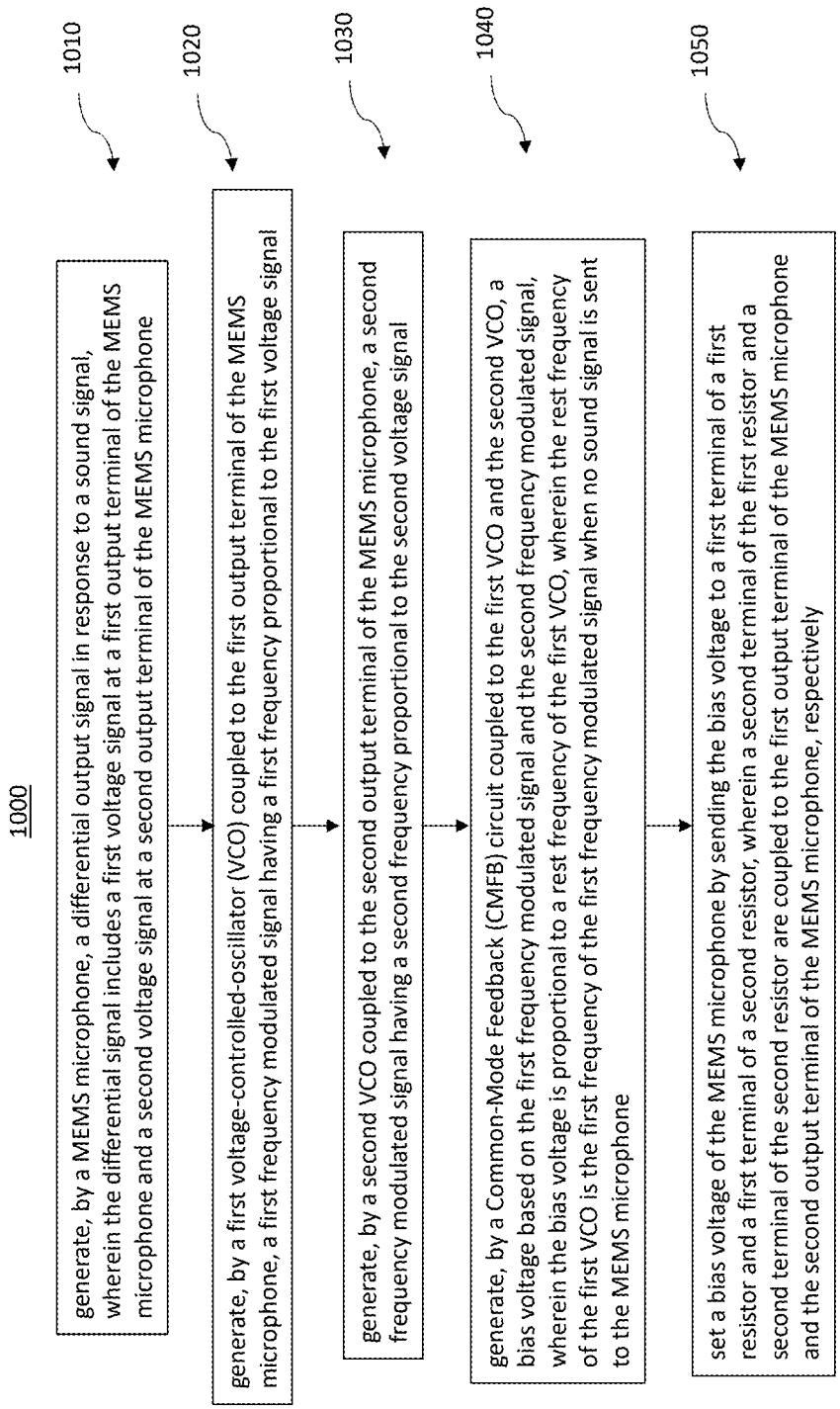
FIG. 10 illustrates a flow chart of a method of operating a MEMS microphone system, in an embodiment.

FIG. 10 illustrates a flow chart of a method 1000 of operating a MEMS microphone system, in an embodiment. It should be understood that the embodiment method shown in FIG. 10 is merely an example of many possible embodiment methods. One of ordinary skill in the art would recognize many variations, alternatives, and modifications. For example, various steps as illustrated in FIG. 10 may be added, removed, replaced, rearranged, or repeated.

Referring to FIG. 10, at block 1010, a differential output signal is generated by a MEMS microphone in response to a sound signal, wherein the differential output signal includes a first voltage signal at a first output terminal of the MEMS microphone and a second voltage signal at a second output terminal of the MEMS microphone. At block 1020, a first frequency modulated signal having a first frequency proportional to the first voltage signal is generated by a first voltage-controlled-oscillator (VCO) coupled to the first output terminal of the MEMS microphone. At block 1030, a second frequency modulated signal having a second frequency proportional to the second voltage signal is generated by a second VCO coupled to the second output terminal of the MEMS microphone. At block 1040, a bias voltage based on the first frequency modulated signal and the second frequency modulated signal is generated by a Common-Mode Feedback (CMFB) circuit coupled to the first VCO and the second VCO, wherein the bias voltage is proportional to a rest frequency of the first VCO, wherein the rest frequency of the first VCO is the first frequency of the first frequency modulated signal when no sound signal is sent to the MEMS microphone. At block 1050, a bias voltage of the MEMS microphone is set by sending the bias voltage to a first terminal of a first resistor and a first terminal of a second resistor, wherein a second terminal of the first resistor and a second terminal of the second resistor are coupled to the first output terminal of the MEMS microphone and the second output terminal of the MEMS microphone, respectively.

Embodiments may achieve advantages as described below. The various embodiments of VCO-ADC circuit may be used to form differential MEMS microphone systems or single-ended MEMS microphone systems. By using closed-loop feedback control and the reference generator, the effects of PVT variations are cancelled out, and the rest frequency is automatically controlled at the target frequency.

No calibration is needed for the disclosed MEMS microphone system, which reduces production cost and improves system performance.

Examples of the present invention are summarized here. Other examples can also be understood from the entirety of the specification and the claims filed herein.

Example 1. In an embodiment, a circuit includes: a micro-electromechanical system (MEMS) microphone configured to, in response to a sound signal, generate a differential output signal that includes a first voltage signal at a first output terminal of the MEMS microphone and a second voltage signal at a second output terminal of the MEMS microphone; a first voltage-controlled-oscillator (VCO) coupled to the first output terminal of the MEMS microphone, wherein the first VCO is configured to output, at an output terminal of the first VCO, a first frequency modulated signal having a first frequency proportional to the first voltage signal; a second VCO coupled to the second output terminal of the MEMS microphone, wherein the second VCO is configured to output, at an output terminal of the second VCO, a second frequency modulated signal having a second frequency proportional to the second voltage signal; a Common-Mode Feedback (CMFB) circuit coupled to the output terminal of the first VCO and the output terminal of the second VCO, wherein the CMFB circuit is configured to generate, at an output terminal of the CMFB circuit, a bias voltage based on the first frequency modulated signal and the second frequency modulated signal, wherein the bias voltage is proportional to a rest frequency of the first VCO, wherein the rest frequency of the first VCO is the first frequency of the first frequency modulated signal when no sound signal is sent to the MEMS microphone; a first resistor coupled between the first output terminal of the MEMS microphone and the output terminal of the CMFB circuit; and a second resistor coupled between the second output terminal of the MEMS microphone and the output terminal of the CMFB circuit.

Example 2. The circuit of Example 1, wherein the rest frequency of the first VCO is the same as a rest frequency of the second VCO, wherein the rest frequency of the second VCO is the second frequency of the second frequency modulated signal when no sound signal is sent to the MEMS microphone.

Example 3. The circuit of Example 1, wherein the CMFB circuit comprises a common mode detector, wherein the common mode detector comprises: a first diode-connected transistor coupled between a supply voltage node and a first node; a first frequency-dependent resistor (FDR) coupled between the first node and a reference voltage node, wherein a control terminal of the first FDR is coupled to the output terminal of the first VCO, wherein a resistance of the first FDR is inversely proportional to the first frequency of the first frequency modulated signal; a second FDR coupled in parallel with the first FDR between the first node and the reference voltage node, wherein a control terminal of the second FDR is coupled to the output terminal of the second VCO, wherein a resistance of the second FDR is inversely proportional to the second frequency of the second frequency modulated signal; and a first capacitor coupled between the first node and the reference voltage node.

Example 4. The circuit of Example 3, wherein the first FDR comprises: a first transistor and a second transistor coupled in series between the first node and the reference voltage node, wherein one of the first transistor and the second transistor is an N-type transistor, and another one of the first transistor and the second transistor is a P-type transistor, wherein a gate terminal of the first transistor and a gate terminal of the second transistor are coupled to the control terminal of the first FDR; and a second capacitor coupled between a drain terminal of the second transistor and a source terminal of the second transistor, wherein the second FDR has a same structure as the first FDR.

Example 5. The circuit of Example 4, wherein the CMFB circuit further comprises an error amplifier, wherein the error amplifier comprises: a third transistor coupled between the voltage supply node and the output terminal of the CMFB circuit, wherein a gate terminal of the third transistor is coupled to a gate terminal of the first diode-connected transistor of the common mode detector; and a fourth transistor coupled between the output terminal of the CMFB circuit and the reference voltage node.

Example 6. The circuit of Example 5, wherein the CMFB circuit further comprises a reference generator, wherein the reference generator comprises: a second diode-connected transistor coupled between the supply voltage node and a second node; a third FDR coupled between the second node and the reference voltage node, wherein the third FDR has a same structure as the first FDR, wherein a control terminal of the third FDR is configured to receive a reference frequency signal; a third capacitor coupled between the second node and the reference voltage node; and a fifth transistor and a sixth transistor coupled in series between the voltage supply node and the reference voltage node, wherein a gate terminal of the fifth transistor is coupled to a gate terminal of the second diode-connected transistor, wherein a drain terminal of the sixth transistor and a gate terminal of the sixth transistor are coupled to a gate terminal of the fourth transistor.

Example 7. The circuit of Example 1, further comprising: a first frequency-to-digital (FTD) converter coupled to the output terminal of the first VCO, wherein the first FTD converter is configured to convert the first frequency modulated signal into a first digital output signal proportional to the first frequency; and a second FTD converter coupled to the output terminal of the second VCO, wherein the second FTD converter is configured to convert the second frequency modulated signal into a second digital output signal proportional to the second frequency.

Example 8. In an embodiment, a circuit includes: a micro-electromechanical system (MEMS) microphone configured to generate a first voltage signal at a first output terminal of the MEMS microphone in response to a sound signal; a first voltage-controlled-oscillator (VCO) coupled to the first output terminal of the MEMS microphone, wherein the first VCO is configured to output, at an output terminal of the first VCO, a first frequency modulated signal having a first frequency proportional to the first voltage signal; a first frequency-to-digital (FTD) converter coupled to the output terminal of the first VCO, wherein the first FTD converter is configured to convert the first frequency modulated signal into a first digital output signal proportional to the first frequency; a first frequency-to-voltage (FTV) conversion circuit coupled to the output terminal of the first VCO, wherein the first FTV conversion circuit is configured to generate a first bias voltage in accordance with the first frequency modulated signal, and is configured to output the first bias voltage at an output terminal of the first FTV conversion circuit; and a first resistor coupled between the first output terminal of the MEMS microphone and the output terminal of the first FTV conversion circuit.

Example 9. The circuit of Example 8, wherein the first bias voltage sets a rest frequency of the first VCO.

Example 10. The circuit of Example 8, wherein the first FTV conversion circuit comprises a first FTV converter, wherein the first FTV converter comprises: a diode-connected transistor coupled between a supply voltage node and a first node; a frequency-dependent resistor (FDR) coupled between the first node and a reference voltage node, wherein a control terminal of the FDR is coupled to the output terminal of the first VCO, wherein a resistance of the FDR is inversely proportional to a frequency of a control signal applied at the control terminal of the FDR; and a first capacitor coupled between the first node and the reference voltage node.

Example 11. The circuit of Example 10, wherein the FDR comprises: a first transistor and a second transistor coupled in series between the first node and the reference voltage node, wherein one of the first transistor and the second transistor is an N-type transistor, and another one of the first transistor and the second transistor is a P-type transistor, wherein a gate terminal of the first transistor and a gate terminal of the second transistor are coupled to the control terminal of the FDR; and a second capacitor coupled between a drain terminal of the second transistor and a source terminal of the second transistor.

Example 12. The circuit of Example 11, wherein the first FTV conversion circuit further comprises a first error amplifier, wherein the first error amplifier comprises: a third transistor coupled between the voltage supply node and the output terminal of the first FTV conversion circuit, wherein a gate terminal of the third transistor is coupled to a gate terminal of the diode-connected transistor of the first FTV converter; and a fourth transistor coupled between the output terminal of the first FTV conversion circuit and the reference voltage node.

Example 13. The circuit of Example 12, wherein the first FTV conversion circuit further comprises a first reference generator, wherein the first reference generator comprises: a second FTV converter coupled between the supply voltage node and the reference voltage node, wherein the second FTV converter has a same structure as the first FTV converter, wherein a control terminal of an FDR of the second FTV converter is configured to receive a reference frequency signal; and a fifth transistor and a sixth transistor coupled in series between the voltage supply node and the reference voltage node, wherein a gate terminal of the fifth transistor is coupled to a gate terminal of a diode-connected transistor of the second FTV converter, wherein a drain terminal of the sixth transistor and a gate terminal of the sixth transistor are coupled to a gate terminal of the fourth transistor.

Example 14. The circuit of Example 11, wherein the first FTV conversion circuit further comprises a transimpedance amplifier, wherein the transimpedance amplifier comprises: a third transistor coupled between the voltage supply node and the output terminal of the first FTV conversion circuit, wherein a gate terminal of the third transistor is coupled to a gate terminal of the diode-connected transistor of the first FTV converter; and a second resistor or a fourth transistor coupled between the output terminal of the first FTV conversion circuit and the reference voltage node.

Example 15. The circuit of Example 13, wherein the MEMS microphone is configured to generate a differential output signal that includes the first voltage signal at the first output terminal of the MEMS microphone and a second voltage signal at a second output terminal of the MEMS microphone, wherein the circuit further comprises: a second VCO coupled to the second output terminal of the MEMS microphone, wherein the second VCO is configured to output, at an output terminal of the second VCO, a second frequency modulated signal having a second frequency proportional to the second voltage signal; a second FTD converter coupled to the output terminal of the second VCO, wherein the second FTD converter is configured to convert the second frequency modulated signal into a second digital output signal proportional to the second frequency; a second FTV conversion circuit coupled to the output terminal of the second VCO, wherein the second FTV conversion circuit is configured to generate a second bias voltage in accordance with the second frequency modulated signal, and is configured to output the second bias voltage at an output terminal of the second FTV conversion circuit; and a second resistor coupled between the second output terminal of the MEMS microphone and the output terminal of the second FTV conversion circuit.

Example 16. The circuit of Example 15, wherein the first VCO and the second VCO have a same structure, wherein the first FTD converter and the second FTD converter have a same structure, wherein the first FTV conversion circuit and the second FTV conversion circuit have a same structure.

Example 17. In an embodiment, a method of operating a micro-electromechanical system (MEMS) microphone system includes: generating, by a MEMS microphone, a differential output signal in response to a sound signal, wherein the differential output signal includes a first voltage signal at a first output terminal of the MEMS microphone and a second voltage signal at a second output terminal of the MEMS microphone; generating, by a first voltage-controlled-oscillator (VCO) coupled to the first output terminal of the MEMS microphone, a first frequency modulated signal having a first frequency proportional to the first voltage signal; generating, by a second VCO coupled to the second output terminal of the MEMS microphone, a second frequency modulated signal having a second frequency proportional to the second voltage signal; generating, by a Common-Mode Feedback (CMFB) circuit coupled to the first VCO and the second VCO, a bias voltage based on the first frequency modulated signal and the second frequency modulated signal, wherein the bias voltage is proportional to a rest frequency of the first VCO, wherein the rest frequency of the first VCO is the first frequency of the first frequency modulated signal when no sound signal is sent to the MEMS microphone; and setting a bias voltage of the MEMS microphone by sending the bias voltage to a first terminal of a first resistor and a first terminal of a second resistor, wherein a second terminal of the first resistor and a second terminal of the second resistor are coupled to the first output terminal of the MEMS microphone and the second output terminal of the MEMS microphone, respectively.

Example 18. The method of Example 17, further comprising: converting the first frequency modulated signal into a first digital output signal proportional to the first frequency using a first frequency-to-digital (FTD) converter coupled to the first VCO; and converting the second frequency modulated signal into a second digital output signal proportional to the second frequency using a second FTD converter coupled to the second VCO.

Example 19. The method of Example 17, wherein generating the bias voltage comprises: generating, by a common mode detector of the CMFB circuit, a current signal based on the first frequency modulated signal and the second frequency modulated signal, wherein the current signal is proportional to the rest frequency of the first VCO, wherein the CMFB circuit comprises a first frequency-dependent resistor (FDR) and a second FDR coupled in parallel, wherein a first resistance of the first FDR and a second resistance of the second FDR are inversely proportional to the first frequency and the second frequency, respectively, wherein a first control terminal of the first FDR and a second control terminal of the second FDR are configured to receive the first frequency modulated signal and the second frequency modulated signal, respectively; generating, by an error amplifier of the CMFB circuit, a mirror current of the current signal; and converting, by the error amplifier, the mirror current into the bias voltage by flowing the mirror current through a biased transistor.

Example 20. The method of Example 19, wherein generating the bias voltage further comprises: providing a reference frequency signal to a reference generator of the CMFB circuit, wherein the reference generator is configured to generate a reference bias voltage proportional to a frequency of the reference frequency signal; and sending the reference bias voltage to a gate of the biased transistor.

While this invention has been described with reference to illustrative examples, this description is not intended to be construed in a limiting sense. Various modifications and combinations of the illustrative examples, as well as other examples of the invention, will be apparent to persons skilled in the art upon reference to the description. It is therefore intended that the appended claims encompass any such modifications or examples.

What is claimed is:

1. A circuit comprising:
a micro-electromechanical system (MEMS) microphone configured to, in response to a sound signal, generate a differential output signal that includes a first voltage signal at a first output terminal of the MEMS microphone and a second voltage signal at a second output terminal of the MEMS microphone;
a first voltage-controlled-oscillator (VCO) coupled to the first output terminal of the MEMS microphone, wherein the first VCO is configured to output, at an output terminal of the first VCO, a first frequency modulated signal having a first frequency proportional to the first voltage signal;
a second VCO coupled to the second output terminal of the MEMS microphone, wherein the second VCO is configured to output, at an output terminal of the second VCO, a second frequency modulated signal having a second frequency proportional to the second voltage signal;
a Common-Mode Feedback (CMFB) circuit coupled to the output terminal of the first VCO and the output terminal of the second VCO, wherein the CMFB circuit is configured to generate, at an output terminal of the CMFB circuit, a bias voltage based on the first frequency modulated signal and the second frequency modulated signal, wherein the bias voltage is proportional to a rest frequency of the first VCO, wherein the rest frequency of the first VCO is the first frequency of the first frequency modulated signal when no sound signal is sent to the MEMS microphone;
a first resistor coupled between the first output terminal of the MEMS microphone and the output terminal of the CMFB circuit; and
a second resistor coupled between the second output terminal of the MEMS microphone and the output terminal of the CMFB circuit.

2. The circuit of claim 1, wherein the rest frequency of the first VCO is the same as a rest frequency of the second VCO, wherein the rest frequency of the second VCO is the second frequency of the second frequency modulated signal when no sound signal is sent to the MEMS microphone.

3. The circuit of claim 1, wherein the CMFB circuit comprises a common mode detector, wherein the common mode detector comprises:
a first diode-connected transistor coupled between a supply voltage node and a first node;
a first frequency-dependent resistor (FDR) coupled between the first node and a reference voltage node, wherein a control terminal of the first FDR is coupled to the output terminal of the first VCO, wherein a resistance of the first FDR is inversely proportional to the first frequency of the first frequency modulated signal;
a second FDR coupled in parallel with the first FDR between the first node and the reference voltage node, wherein a control terminal of the second FDR is coupled to the output terminal of the second VCO, wherein a resistance of the second FDR is inversely proportional to the second frequency of the second frequency modulated signal; and
a first capacitor coupled between the first node and the reference voltage node.

4. The circuit of claim 3, wherein the first FDR comprises:
a first transistor and a second transistor coupled in series between the first node and the reference voltage node, wherein one of the first transistor and the second transistor is an N-type transistor, and another one of the first transistor and the second transistor is a P-type transistor, wherein a gate terminal of the first transistor and a gate terminal of the second transistor are coupled to the control terminal of the first FDR; and
a second capacitor coupled between a drain terminal of the second transistor and a source terminal of the second transistor, wherein the second FDR has a same structure as the first FDR.

5. The circuit of claim 4, wherein the CMFB circuit further comprises an error amplifier, wherein the error amplifier comprises:
a third transistor coupled between the voltage supply node and the output terminal of the CMFB circuit, wherein a gate terminal of the third transistor is coupled to a gate terminal of the first diode-connected transistor of the common mode detector; and
a fourth transistor coupled between the output terminal of the CMFB circuit and the reference voltage node.

6. The circuit of claim 5, wherein the CMFB circuit further comprises a reference generator, wherein the reference generator comprises:
a second diode-connected transistor coupled between the supply voltage node and a second node;
a third FDR coupled between the second node and the reference voltage node, wherein the third FDR has a same structure as the first FDR, wherein a control terminal of the third FDR is configured to receive a reference frequency signal;
a third capacitor coupled between the second node and the reference voltage node; and
a fifth transistor and a sixth transistor coupled in series between the voltage supply node and the reference voltage node, wherein a gate terminal of the fifth transistor is coupled to a gate terminal of the second diode-connected transistor, wherein a drain terminal of the sixth transistor and a gate terminal of the sixth transistor are coupled to a gate terminal of the fourth transistor.

7. The circuit of claim 1, further comprising:
a first frequency-to-digital (FTD) converter coupled to the output terminal of the first VCO, wherein the first FTD converter is configured to convert the first frequency modulated signal into a first digital output signal proportional to the first frequency; and a second FTD converter coupled to the output terminal of the second VCO, wherein the second FTD converter is configured to convert the second frequency modulated signal into a second digital output signal proportional to the second frequency.

8. A circuit comprising:

a micro-electromechanical system (MEMS) microphone configured to generate a first voltage signal at a first output terminal of the MEMS microphone in response to a sound signal;

a first voltage-controlled-oscillator (VCO) coupled to the first output terminal of the MEMS microphone, wherein the first VCO is configured to output, at an output terminal of the first VCO, a first frequency modulated signal having a first frequency proportional to the first voltage signal;

a first frequency-to-digital (FTD) converter coupled to the output terminal of the first VCO, wherein the first FTD converter is configured to convert the first frequency modulated signal into a first digital output signal proportional to the first frequency;

a first frequency-to-voltage (FTV) conversion circuit coupled to the output terminal of the first VCO, wherein the first FTV conversion circuit is configured to generate a first bias voltage in accordance with the first frequency modulated signal, and is configured to output the first bias voltage at an output terminal of the first FTV conversion circuit; and a first resistor coupled between the first output terminal of the MEMS microphone and the output terminal of the first FTV conversion circuit.

9. The circuit of claim 8, wherein the first bias voltage sets a rest frequency of the first VCO.

10. The circuit of claim 8, wherein the first FTV conversion circuit comprises a first FTV converter, wherein the first FTV converter comprises:

a diode-connected transistor coupled between a supply voltage node and a first node;

a frequency-dependent resistor (FDR) coupled between the first node and a reference voltage node, wherein a control terminal of the FDR is coupled to the output terminal of the first VCO, wherein a resistance of the FDR is inversely proportional to a frequency of a control signal applied at the control terminal of the FDR; and a first capacitor coupled between the first node and the reference voltage node.

11. The circuit of claim 10, wherein the FDR comprises:

a first transistor and a second transistor coupled in series between the first node and the reference voltage node, wherein one of the first transistor and the second transistor is an N-type transistor, and another one of the first transistor and the second transistor is a P-type transistor, wherein a gate terminal of the first transistor and a gate terminal of the second transistor are coupled to the control terminal of the FDR; and a second capacitor coupled between a drain terminal of the second transistor and a source terminal of the second transistor.

12. The circuit of claim 11, wherein the first FTV conversion circuit further comprises a first error amplifier, wherein the first error amplifier comprises:

a third transistor coupled between the voltage supply node and the output terminal of the first FTV conversion circuit, wherein a gate terminal of the third transistor is coupled to a gate terminal of the diode-connected transistor of the first FTV converter; and a fourth transistor coupled between the output terminal of the first FTV conversion circuit and the reference voltage node.

13. The circuit of claim 12, wherein the first FTV conversion circuit further comprises a first reference generator, wherein the first reference generator comprises:

a second FTV converter coupled between the supply voltage node and the reference voltage node, wherein the second FTV converter has a same structure as the first FTV converter, wherein a control terminal of an FDR of the second FTV converter is configured to receive a reference frequency signal; and a fifth transistor and a sixth transistor coupled in series between the voltage supply node and the reference voltage node, wherein a gate terminal of the fifth transistor is coupled to a gate terminal of a diode-connected transistor of the second FTV converter, wherein a drain terminal of the sixth transistor and a gate terminal of the sixth transistor are coupled to a gate terminal of the fourth transistor.

14. The circuit of claim 11, wherein the first FTV conversion circuit further comprises a transimpedance amplifier, wherein the transimpedance amplifier comprises:

a third transistor coupled between the voltage supply node and the output terminal of the first FTV conversion circuit, wherein a gate terminal of the third transistor is coupled to a gate terminal of the diode-connected transistor of the first FTV converter; and a second resistor or a fourth transistor coupled between the output terminal of the first FTV conversion circuit and the reference voltage node.

15. The circuit of claim 13, wherein the MEMS microphone is configured to generate a differential output signal that includes the first voltage signal at the first output terminal of the MEMS microphone and a second voltage signal at a second output terminal of the MEMS microphone, wherein the circuit further comprises:

a second VCO coupled to the second output terminal of the MEMS microphone, wherein the second VCO is configured to output, at an output terminal of the second VCO, a second frequency modulated signal having a second frequency proportional to the second voltage signal;

a second FTD converter coupled to the output terminal of the second VCO, wherein the second FTD converter is configured to convert the second frequency modulated signal into a second digital output signal proportional to the second frequency;

a second FTV conversion circuit coupled to the output terminal of the second VCO, wherein the second FTV conversion circuit is configured to generate a second bias voltage in accordance with the second frequency modulated signal, and is configured to output the second bias voltage at an output terminal of the second FTV conversion circuit; and a second resistor coupled between the second output terminal of the MEMS microphone and the output terminal of the second FTV conversion circuit.

16. The circuit of claim 15, wherein the first VCO and the second VCO have a same structure, wherein the first FTD converter and the second FTD converter have a same structure, wherein the first FTV conversion circuit and the second FTV conversion circuit have a same structure.

17. A method of operating a micro-electromechanical system (MEMS) microphone system, the method comprising:
- generating, by a MEMS microphone, a differential output signal in response to a sound signal, wherein the differential output signal includes a first voltage signal at a first output terminal of the MEMS microphone and a second voltage signal at a second output terminal of the MEMS microphone;
- generating, by a first voltage-controlled-oscillator (VCO) coupled to the first output terminal of the MEMS microphone, a first frequency modulated signal having a first frequency proportional to the first voltage signal;
- generating, by a second VCO coupled to the second output terminal of the MEMS microphone, a second frequency modulated signal having a second frequency proportional to the second voltage signal;
- generating, by a Common-Mode Feedback (CMFB) circuit coupled to the first VCO and the second VCO, a bias voltage based on the first frequency modulated signal and the second frequency modulated signal, wherein the bias voltage is proportional to a rest frequency of the first VCO, wherein the rest frequency of the first VCO is the first frequency of the first frequency modulated signal when no sound signal is sent to the MEMS microphone; and
- setting a bias voltage of the MEMS microphone by sending the bias voltage to a first terminal of a first resistor and a first terminal of a second resistor, wherein a second terminal of the first resistor and a second terminal of the second resistor are coupled to the first output terminal of the MEMS microphone and the second output terminal of the MEMS microphone, respectively.

18. The method of claim 17, further comprising:
converting the first frequency modulated signal into a first digital output signal proportional to the first frequency using a first frequency-to-digital (FTD) converter coupled to the first VCO; and
converting the second frequency modulated signal into a second digital output signal proportional to the second frequency using a second FTD converter coupled to the second VCO.

19. The method of claim 17, wherein generating the bias voltage comprises:
- generating, by a common mode detector of the CMFB circuit, a current signal based on the first frequency modulated signal and the second frequency modulated signal, wherein the current signal is proportional to the rest frequency of the first VCO, wherein the CMFB circuit comprises a first frequency-dependent resistor (FDR) and a second FDR coupled in parallel, wherein a first resistance of the first FDR and a second resistance of the second FDR are inversely proportional to the first frequency and the second frequency, respectively, wherein a first control terminal of the first FDR and a second control terminal of the second FDR are configured to receive the first frequency modulated signal and the second frequency modulated signal, respectively;
- generating, by an error amplifier of the CMFB circuit, a mirror current of the current signal; and
- converting, by the error amplifier, the mirror current into the bias voltage by flowing the mirror current through a biased transistor.

20. The method of claim 19, wherein generating the bias voltage further comprises:
providing a reference frequency signal to a reference generator of the CMFB circuit, wherein the reference generator is configured to generate a reference bias voltage proportional to a frequency of the reference frequency signal; and sending the reference bias voltage to a gate of the biased transistor.

* * * * *